(12) United States Patent
Lung et al.

(10) Patent No.: US 7,785,920 B2
(45) Date of Patent: Aug. 31, 2010

(54) METHOD FOR MAKING A PILLAR-TYPE PHASE CHANGE MEMORY ELEMENT

(75) Inventors: Hsiang-Lan Lung, Elmsford, NY (US); ChiaHua Ho, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 286 days.

(21) Appl. No.: 11/456,922

(22) Filed: Jul. 12, 2006

(65) Prior Publication Data

US 2008/0014676 A1    Jan. 17, 2008

(51) Int. Cl.
*H01L 21/00* (2006.01)

(52) U.S. Cl. .................. 438/95; 438/84; 438/102; 438/104; 257/E21.014; 257/E21.209; 257/E21.215

(58) Field of Classification Search .............. 438/84, 438/85; 257/E21.014, E21.045, E21.061, 257/E21.477, E21.613, E21.662
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,452,592 A | 6/1984 | Tsai | |
| 4,599,705 A | 7/1986 | Holmberg et al. | |
| 4,719,594 A | 1/1988 | Young et al. | |
| 4,769,339 A | 9/1988 | Ishii et al. | |
| 4,876,220 A | 10/1989 | Mohsen et al. | |
| 4,959,812 A | 9/1990 | Momodomi et al. | |
| 5,106,775 A | 4/1992 | Kaga et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,332,923 A | 7/1994 | Takeuchi et al. | |
| 5,391,901 A | 2/1995 | Tanabe et al. | |

(Continued)

FOREIGN PATENT DOCUMENTS

TW            522470 B       3/2003

(Continued)

OTHER PUBLICATIONS

Adler, David, "Amorphous-Semiconductor Devices," Sci. Amer., vol. 236, pp. 36-48, May 1977.

(Continued)

*Primary Examiner*—Charles D Garber
*Assistant Examiner*—Cheung Lee
(74) *Attorney, Agent, or Firm*—James F. Hann; Haynes Beffel & Wolfeld LLP (57) ABSTRACT

A pillar-type phase change memory element comprises first and second electrode elements and a phase change element therebetween. A second electrode material and a chlorine-sensitive phase change material are selected. A first electrode element is formed. The phase change material is deposited on the first electrode element and the second electrode material is deposited on the phase change material. The second electrode material and the phase change material are etched without the use of chlorine to form a second electrode element and a phase change element. The second electrode material selecting step, the phase change material selecting step and the etching procedure selecting step are carried out so that the phase change element is not undercut relative to the second electrode element during etching.

10 Claims, 3 Drawing Sheets

U.S. PATENT DOCUMENTS

| | | | |
|---|---|---|---|
| 5,515,488 A | 5/1996 | Hoppe et al. | |
| 5,534,712 A | 7/1996 | Ovshinsky et al. | |
| 5,550,396 A | 8/1996 | Tsutsumi et al. | |
| 5,687,112 A | 11/1997 | Ovshinsky | |
| 5,688,713 A | 11/1997 | Linliu et al. | |
| 5,716,883 A | 2/1998 | Tseng et al. | |
| 5,754,472 A | 5/1998 | Sim et al. | |
| 5,789,277 A | 8/1998 | Zahorik et al. | |
| 5,789,758 A | 8/1998 | Reinberg | |
| 5,814,527 A | 9/1998 | Wolstenholme et al. | |
| 5,831,276 A | 11/1998 | Gonzalez et al. | |
| 5,837,564 A | 11/1998 | Sandhu et al. | |
| 5,869,843 A | 2/1999 | Harshfield | |
| 5,879,955 A | 3/1999 | Gonzalez et al. | |
| 5,902,704 A | 5/1999 | Schoenborn et al. | |
| 5,920,788 A | 7/1999 | Reinberg | |
| 5,933,365 A | 8/1999 | Klersy et al. | |
| 5,952,671 A | 9/1999 | Reinberg et al. | |
| 5,958,358 A | 9/1999 | Tenne et al. | |
| 5,970,336 A | 10/1999 | Wolstenholme et al. | |
| 5,985,698 A | 11/1999 | Gonzalez et al. | |
| 5,998,244 A | 12/1999 | Wolstenholme et al. | |
| 6,011,725 A | 1/2000 | Eitan | |
| 6,025,220 A | 2/2000 | Sandhu | |
| 6,031,287 A | 2/2000 | Harshfield | |
| 6,034,882 A | 3/2000 | Johnson et al. | |
| 6,046,951 A | 4/2000 | El Hajji et al. | |
| 6,066,870 A | 5/2000 | Siek | |
| 6,077,674 A | 6/2000 | Schleifer et al. | |
| 6,077,729 A | 6/2000 | Harshfield | |
| 6,087,269 A | 7/2000 | Williams | |
| 6,087,674 A | 7/2000 | Ovshinsky et al. | |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,147,395 A | 11/2000 | Gilgen | |
| 6,150,253 A | 11/2000 | Doan et al. | |
| 6,153,890 A | 11/2000 | Wolstenholme et al. | |
| 6,177,317 B1 | 1/2001 | Huang et al. | |
| 6,185,122 B1 | 2/2001 | Johnson et al. | |
| 6,189,582 B1 | 2/2001 | Reinberg et al. | |
| 6,236,059 B1 | 5/2001 | Wolstenholme et al. | |
| RE37,259 E | 7/2001 | Ovshinsky | |
| 6,271,090 B1 | 8/2001 | Huang et al. | |
| 6,280,684 B1 | 8/2001 | Yamada et al. | |
| 6,287,887 B1 | 9/2001 | Gilgen | |
| 6,291,137 B1 | 9/2001 | Lyons et al. | |
| 6,314,014 B1 | 11/2001 | Lowrey et al. | |
| 6,316,348 B1 | 11/2001 | Fu et al. | |
| 6,320,786 B1 | 11/2001 | Chang et al. | |
| 6,326,307 B1 | 12/2001 | Lindley et al. | |
| 6,337,266 B1 | 1/2002 | Zahorik | |
| 6,339,544 B1 | 1/2002 | Chiang et al. | |
| 6,351,406 B1 | 2/2002 | Johnson et al. | |
| 6,372,651 B1 | 4/2002 | Yang et al. | |
| 6,380,068 B2 | 4/2002 | Jeng et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,440,837 B1 | 8/2002 | Harshfield | |
| 6,462,353 B1 | 10/2002 | Gilgen | |
| 6,483,736 B2 | 11/2002 | Johnson et al. | |
| 6,487,106 B1 | 11/2002 | Kozicki | |
| 6,487,114 B2 | 11/2002 | Jong et al. | |
| 6,501,111 B1 | 12/2002 | Lowrey | |
| 6,511,867 B2 | 1/2003 | Lowrey et al. | |
| 6,512,241 B1 | 1/2003 | Lai | |
| 6,514,788 B2 | 2/2003 | Quinn | |
| 6,514,820 B2 | 2/2003 | Ahn et al. | |
| 6,534,781 B2 | 3/2003 | Dennison | |
| 6,545,903 B1 | 4/2003 | Wu | |
| 6,551,866 B1 | 4/2003 | Maeda et al. | |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,576,546 B2 | 6/2003 | Gilbert et al. | |
| 6,579,760 B1 | 6/2003 | Lung | |
| 6,586,761 B2 | 7/2003 | Lowrey | |
| 6,589,714 B2 | 7/2003 | Maimon et al. | |
| 6,593,176 B2 | 7/2003 | Dennison | |
| 6,596,589 B2 | 7/2003 | Tseng et al. | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 | 9/2003 | Lowrey et al. | |
| 6,621,095 B2 | 9/2003 | Chiang et al. | |
| 6,627,530 B2 | 9/2003 | Li et al. | |
| 6,639,849 B2 | 10/2003 | Takahashi et al. | |
| 6,673,700 B2 | 1/2004 | Dennison et al. | |
| 6,674,115 B2 | 1/2004 | Hudgens et al. | |
| 6,677,678 B2 | 1/2004 | Biolsi et al. | |
| 6,744,088 B1 | 6/2004 | Dennison | |
| 6,750,079 B2 | 6/2004 | Lowrey et al. | |
| 6,750,101 B2 | 6/2004 | Lung et al. | |
| 6,791,102 B2 | 9/2004 | Johnson et al. | |
| 6,797,979 B2 | 9/2004 | Chiang et al. | |
| 6,800,504 B2 | 10/2004 | Li et al. | |
| 6,800,563 B2 | 10/2004 | Xu | |
| 6,805,563 B2 | 10/2004 | Ohashi | |
| 6,815,704 B1 | 11/2004 | Chen | |
| 6,830,952 B2 | 12/2004 | Lung et al. | |
| 6,838,692 B1 | 1/2005 | Lung et al. | |
| 6,850,432 B2 | 2/2005 | Lu et al. | |
| 6,859,389 B2 | 2/2005 | Idehara et al. | |
| 6,861,267 B2 | 3/2005 | Xu et al. | |
| 6,864,500 B2 | 3/2005 | Gilton | |
| 6,864,503 B2 | 3/2005 | Lung | |
| 6,867,638 B2 | 3/2005 | Saiki et al. | |
| 6,881,603 B2 | 4/2005 | Lai | |
| 6,888,750 B2 | 5/2005 | Walker et al. | |
| 6,894,304 B2 | 5/2005 | Moore | |
| 6,894,305 B2 | 5/2005 | Yi et al. | |
| 6,900,517 B2 | 5/2005 | Tanaka et al. | |
| 6,903,362 B2 | 6/2005 | Wyeth et al. | |
| 6,909,107 B2 | 6/2005 | Rodgers et al. | |
| 6,910,907 B2 | 6/2005 | Layadi et al. | |
| 6,927,410 B2 | 8/2005 | Chen | |
| 6,928,022 B2 | 8/2005 | Cho et al. | |
| 6,933,516 B2 | 8/2005 | Xu | |
| 6,936,544 B2 | 8/2005 | Huang et al. | |
| 6,936,840 B2 | 8/2005 | Sun et al. | |
| 6,937,507 B2 | 8/2005 | Chen | |
| 6,943,365 B2 | 9/2005 | Lowrey et al. | |
| 6,969,866 B1 | 11/2005 | Lowrey et al. | |
| 6,972,428 B2 | 12/2005 | Maimon | |
| 6,972,430 B2 | 12/2005 | Casagrande et al. | |
| 6,977,181 B1 | 12/2005 | Raberg et al. | |
| 6,992,932 B2 | 1/2006 | Cohen | |
| 7,023,009 B2 | 4/2006 | Kostylev et al. | |
| 7,033,856 B2 | 4/2006 | Lung et al. | |
| 7,038,230 B2 | 5/2006 | Chen et al. | |
| 7,038,938 B2 | 5/2006 | Kang et al. | |
| 7,042,001 B2 | 5/2006 | Kim et al. | |
| 7,054,183 B2 | 5/2006 | Rinerson et al. | |
| 7,067,837 B2 | 6/2006 | Hwang et al. | |
| 7,067,864 B2 | 6/2006 | Nishida et al. | |
| 7,067,865 B2 | 6/2006 | Lung et al. | |
| 7,078,273 B2 | 7/2006 | Matsuoka et al. | |

| | | | | | | |
|---|---|---|---|---|---|---|
| 7,099,180 B1 | 8/2006 | Dodge et al. | | 2005/0263829 A1 | 12/2005 | Song et al. |
| 7,115,927 B2 | 10/2006 | Hideki et al. | | 2006/0006472 A1 | 1/2006 | Jiang |
| 7,122,281 B2 | 10/2006 | Pierrat | | 2006/0038221 A1 | 2/2006 | Lee et al. |
| 7,122,824 B2 | 10/2006 | Khouri et al. | | 2006/0066156 A1 | 3/2006 | Dong et al. |
| 7,126,149 B2 | 10/2006 | Iwasaki et al. | | 2006/0073642 A1 | 4/2006 | Yeh et al. |
| 7,132,675 B2 | 11/2006 | Gilton | | 2006/0091476 A1 | 5/2006 | Pinnow et al. |
| 7,151,273 B2 | 12/2006 | Campbell et al. | | 2006/0094154 A1 | 5/2006 | Lung |
| 7,154,774 B2 | 12/2006 | Bedeschi et al. | | 2006/0108667 A1 | 5/2006 | Lung |
| 7,158,411 B2 | 1/2007 | Yeh et al. | | 2006/0110878 A1 | 5/2006 | Lung et al. |
| 7,164,147 B2 | 1/2007 | Lee et al. | | 2006/0110888 A1 | 5/2006 | Cho et al. |
| 7,166,533 B2 | 1/2007 | Happ | | 2006/0113520 A1 | 6/2006 | Yamamoto et al. |
| 7,169,635 B2 | 1/2007 | Kozicki | | 2006/0113521 A1 | 6/2006 | Lung |
| 7,202,493 B2 | 4/2007 | Lung et al. | | 2006/0118913 A1 | 6/2006 | Yi et al. |
| 7,208,751 B2 | 4/2007 | Ooishi et al. | | 2006/0124916 A1 | 6/2006 | Lung |
| 7,214,958 B2 | 5/2007 | Happ | | 2006/0126395 A1 | 6/2006 | Chen et al. |
| 7,220,983 B2 | 5/2007 | Lung | | 2006/0131555 A1 | 6/2006 | Liu et al. |
| 7,229,883 B2 | 6/2007 | Wang et al. | | 2006/0138467 A1 | 6/2006 | Lung |
| 7,238,959 B2 | 7/2007 | Chen | | 2006/0154185 A1 | 7/2006 | Ho et al. |
| 7,238,994 B2 | 7/2007 | Chen et al. | | 2006/0157681 A1 | 7/2006 | Chen et al. |
| 7,248,494 B2 | 7/2007 | Oh et al. | | 2006/0163554 A1 | 7/2006 | Lankhorst et al. |
| 7,251,157 B2 | 7/2007 | Osada et al. | | 2006/0172067 A1 | 8/2006 | Ovshinsky et al. |
| 7,253,429 B2 | 8/2007 | Klersy et al. | | 2006/0175599 A1 | 8/2006 | Happ |
| 7,254,059 B2 | 8/2007 | Li et al. | | 2006/0198183 A1 | 9/2006 | Kawahara et al. |
| 7,269,052 B2 | 9/2007 | Segal et al. | | 2006/0205108 A1 | 9/2006 | Maimon et al. |
| 7,277,317 B2 | 10/2007 | Le Phan et al. | | 2006/0211165 A1 | 9/2006 | Hwang et al. |
| 7,291,556 B2 | 11/2007 | Choi et al. | | 2006/0226409 A1 | 10/2006 | Burr et al. |
| 7,309,630 B2 | 12/2007 | Fan et al. | | 2006/0234138 A1 | 10/2006 | Fehlhaber et al. |
| 7,321,130 B2 | 1/2008 | Lung et al. | | 2006/0237756 A1 | 10/2006 | Park et al. |
| 7,323,708 B2 | 1/2008 | Lee et al. | | 2006/0245236 A1 | 11/2006 | Zaidi |
| 7,332,370 B2 | 2/2008 | Chang et al. | | 2006/0250885 A1 | 11/2006 | Cho et al. |
| 7,336,526 B2 | 2/2008 | Osada et al. | | 2006/0261392 A1 | 11/2006 | Lee et al. |
| 7,351,648 B2 | 4/2008 | Furukawa et al. | | 2006/0266993 A1 | 11/2006 | Suh et al. |
| 7,359,231 B2 | 4/2008 | Venkataraman et al. | | 2006/0284157 A1 | 12/2006 | Chen et al. |
| 7,364,935 B2 | 4/2008 | Lung et al. | | 2006/0284158 A1 | 12/2006 | Lung et al. |
| 7,365,385 B2 | 4/2008 | Abbott | | 2006/0284214 A1 | 12/2006 | Chen |
| 7,379,328 B2 | 5/2008 | Osada et al. | | 2006/0284279 A1 | 12/2006 | Lung et al. |
| 7,385,235 B2 | 6/2008 | Lung et al. | | 2006/0286709 A1 | 12/2006 | Lung et al. |
| 7,394,088 B2 | 7/2008 | Lung | | 2006/0286743 A1 | 12/2006 | Lung et al. |
| 7,397,060 B2 | 7/2008 | Lung | | 2006/0289848 A1 | 12/2006 | Dennison |
| 7,423,300 B2 | 9/2008 | Lung et al. | | 2007/0008786 A1 | 1/2007 | Scheuerlein |
| 7,426,134 B2 | 9/2008 | Happ et al. | | 2007/0030721 A1 | 2/2007 | Segal et al. |
| 7,440,308 B2 | 10/2008 | Jeong et al. | | 2007/0037101 A1 | 2/2007 | Morioka |
| 7,449,710 B2 | 11/2008 | Lung | | 2007/0096162 A1 | 5/2007 | Happ et al. |
| 7,473,576 B2 | 1/2009 | Lung | | 2007/0096248 A1 | 5/2007 | Philipp et al. |
| 7,479,649 B2 | 1/2009 | Lung | | 2007/0108077 A1 | 5/2007 | Lung et al. |
| 7,507,986 B2 | 3/2009 | Lung | | 2007/0108429 A1 | 5/2007 | Lung |
| 7,514,334 B2 | 4/2009 | Chen et al. | | 2007/0108430 A1 | 5/2007 | Lung |
| 7,515,461 B2 | 4/2009 | Happ et al. | | 2007/0108431 A1 | 5/2007 | Chen et al. |
| 2002/0070457 A1 | 6/2002 | Sun et al. | | 2007/0109836 A1 | 5/2007 | Lung |
| 2002/0113273 A1 | 8/2002 | Hwang et al. | | 2007/0109843 A1 | 5/2007 | Lung et al. |
| 2002/0123169 A1* | 9/2002 | Moore et al. ................ 438/95 | | 2007/0111429 A1 | 5/2007 | Lung |
| 2003/0072195 A1 | 4/2003 | Mikolajick | | 2007/0115794 A1 | 5/2007 | Lung |
| 2003/0095426 A1 | 5/2003 | Hush et al. | | 2007/0117315 A1 | 5/2007 | Lai et al. |
| 2003/0186481 A1 | 10/2003 | Lung | | 2007/0120104 A1 | 5/2007 | Ahn et al. |
| 2004/0026686 A1 | 2/2004 | Lung | | 2007/0121363 A1 | 5/2007 | Lung |
| 2004/0051094 A1 | 3/2004 | Ooishi | | 2007/0121374 A1 | 5/2007 | Lung et al. |
| 2004/0113137 A1* | 6/2004 | Lowrey ........................ 257/5 | | 2007/0126040 A1 | 6/2007 | Lung |
| 2004/0165422 A1 | 8/2004 | Hideki et al. | | 2007/0131922 A1 | 6/2007 | Lung |
| 2004/0248339 A1* | 12/2004 | Lung ........................ 438/102 | | 2007/0131980 A1 | 6/2007 | Lung |
| 2004/0256610 A1 | 12/2004 | Lung | | 2007/0138458 A1 | 6/2007 | Lung |
| 2005/0018526 A1 | 1/2005 | Lee | | 2007/0147105 A1 | 6/2007 | Lung et al. |
| 2005/0029502 A1 | 2/2005 | Hudgens | | 2007/0153563 A1 | 7/2007 | Nirschl |
| 2005/0052904 A1 | 3/2005 | Cho et al. | | 2007/0154847 A1 | 7/2007 | Chen et al. |
| 2005/0062087 A1 | 3/2005 | Chen et al. | | 2007/0155172 A1 | 7/2007 | Lai et al. |
| 2005/0093022 A1 | 5/2005 | Lung | | 2007/0156949 A1 | 7/2007 | Rudelic et al. |
| 2005/0127349 A1 | 6/2005 | Horak et al. | | 2007/0158632 A1 | 7/2007 | Ho |
| 2005/0145984 A1 | 7/2005 | Chen et al. | | 2007/0158633 A1 | 7/2007 | Lai et al. |
| 2005/0167656 A1 | 8/2005 | Sun et al. | | 2007/0158645 A1 | 7/2007 | Lung |
| 2005/0191804 A1 | 9/2005 | Lai et al. | | 2007/0158690 A1 | 7/2007 | Ho et al. |
| 2005/0201182 A1 | 9/2005 | Osada et al. | | 2007/0158862 A1 | 7/2007 | Lung |
| 2005/0212024 A1 | 9/2005 | Happ | | 2007/0161186 A1 | 7/2007 | Ho |
| 2005/0212026 A1 | 9/2005 | Chung et al. | | 2007/0170881 A1 | 7/2007 | Noh et al. |
| 2005/0215009 A1 | 9/2005 | Cho | | 2007/0173019 A1 | 7/2007 | Ho et al. |

| | | | |
|---|---|---|---|
| 2007/0173063 A1 | 7/2007 | Lung | |
| 2007/0176261 A1 | 8/2007 | Lung | |
| 2007/0187664 A1 | 8/2007 | Happ | |
| 2007/0201267 A1 | 8/2007 | Happ et al. | |
| 2007/0215852 A1 | 9/2007 | Lung | |
| 2007/0224726 A1 | 9/2007 | Chen et al. | |
| 2007/0235811 A1 | 10/2007 | Furukawa et al. | |
| 2007/0236989 A1 | 10/2007 | Lung | |
| 2007/0246699 A1 | 10/2007 | Lung | |
| 2007/0249090 A1* | 10/2007 | Philipp et al. | 438/102 |
| 2007/0257300 A1 | 11/2007 | Ho et al. | |
| 2007/0262388 A1 | 11/2007 | Ho et al. | |
| 2007/0267618 A1 | 11/2007 | Zaidi et al. | |
| 2007/0274121 A1 | 11/2007 | Lung et al. | |
| 2007/0285960 A1 | 12/2007 | Lung et al. | |
| 2007/0298535 A1 | 12/2007 | Lung | |
| 2008/0006811 A1 | 1/2008 | Philipp et al. | |
| 2008/0012000 A1 | 1/2008 | Harshfield | |
| 2008/0014676 A1 | 1/2008 | Lung et al. | |
| 2008/0025089 A1 | 1/2008 | Scheuerlein et al. | |
| 2008/0043520 A1 | 2/2008 | Chen | |
| 2008/0094871 A1 | 4/2008 | Parkinson | |
| 2008/0101110 A1 | 5/2008 | Happ et al. | |
| 2008/0137400 A1 | 6/2008 | Chen et al. | |
| 2008/0164453 A1 | 7/2008 | Breitwisch et al. | |
| 2008/0165569 A1 | 7/2008 | Chen et al. | |
| 2008/0165570 A1 | 7/2008 | Happ et al. | |
| 2008/0165572 A1 | 7/2008 | Lung | |
| 2008/0166875 A1 | 7/2008 | Lung | |
| 2008/0179852 A1 | 7/2008 | Burr et al. | |
| 2008/0180990 A1 | 7/2008 | Lung | |
| 2008/0186755 A1 | 8/2008 | Lung et al. | |
| 2008/0191187 A1 | 8/2008 | Lung et al. | |
| 2008/0192534 A1 | 8/2008 | Lung | |
| 2008/0197334 A1 | 8/2008 | Lung | |
| 2008/0224119 A1 | 9/2008 | Burr et al. | |
| 2008/0225489 A1 | 9/2008 | Cai et al. | |
| 2008/0265234 A1 | 10/2008 | Breitwisch et al. | |
| 2009/0001341 A1 | 1/2009 | Breitwisch et al. | |
| 2009/0014704 A1 | 1/2009 | Chen et al. | |
| 2009/0023242 A1 | 1/2009 | Lung | |
| 2009/0027950 A1 | 1/2009 | Lam et al. | |
| 2009/0042335 A1 | 2/2009 | Lung | |
| 2009/0057641 A1 | 3/2009 | Lung | |

FOREIGN PATENT DOCUMENTS

| | | |
|---|---|---|
| WO | WO 00/45108 A1 | 8/2000 |
| WO | WO 00/79539 A1 | 12/2000 |
| WO | WO 01/45108 A1 | 6/2001 |
| WO | 0225733 | 3/2002 |

OTHER PUBLICATIONS

Adler, D. et al., "Threshold Switching in Chalcogenide-Glass Thin Films," J. Appl/ Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Axon Technologies Corporation paper: Technology Description, pp. 1-6.

Bedeschi, F. et al., "4-Mb MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al. "An Edge Contact Type Cell fro Phase Change RAM Featuring Very Low Power Consumption," 2003 Symposium on VLSI Technology Digest of Technical Papers, pp. 175-176.

Haring Bolivar, P. et al., "Lateral Design for Phase Change Random Access Memory Cells with Low-Current Consumption," presented at $3^{rd}$ E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hwang, Y. N. et al., "Full Integration and Reliability Evaluation of Phase-change RAM Based on 0.24μm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al. "Reliability Investigations for Manufacturable High Density PRAM," IEEE $43^{rd}$ Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel μTrench Phase-Change Memory Cell for Embedded and Stand-Alone Non-Volatile Memory Applications," 2004 Symposium on VLSI Technology Digest of Technical Papers, pp. 18-19.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era—vol. 4, pp. 674-679, 2004.

Yi, J. H. et al., "Novel Cell Structure of PRAM with Thin Metal Layer Inserted GeSbTe," IEEE IEDM 2003, 4 pages.

Yonehara, T, et al., "Control of Grain Boundary Location by Selective Nucleation Over Amorphous Substrates," Mat. Res. Soc. Symp. Proc., vol. 106, 1998, pp. 21-26.

Gibson, G.A. et al., "Phase-change Recording Medium that Enables Ultrahigh-density Electron-beam Data Storage," Applied Physics Letter, 2005, 3 pp., vol. 86.

Happ, T.D. et al., "Novel None-Mask Self-Heating Pillar Phase Change Memory," 2006 Symposium on VLSI Technology, 2 pp.

Hudgens, S. et al., "Overview of Phase-Change Chalcogenide Nonvolatile Memory Technology," MRS Bulletin, Nov. 2004, pp. 829-832.

"Magnetic Bit Boost," www.sciencenews.org <http://www.sciencenews.org>, Dec. 18 & 25, 2004, p. 389, vol. 166.

"New Memories Tap Spin, Gird for Battle," Science News, Apr. 3, 1999, p. 223, vol. 155.

Pirovano, Agostino et al., "Reliability Study of Phase-Change Nonvolatile Memories," IEEE Transactions on Device and Materials Reliability, Sep. 2004, pp. 422-427, vol. 4, No. 3.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org <http://www.sciencenews.org>, Mar. 19, 2005, p. 189, vol. 167.

Wuttig, Matthias, "Towards a Universal Memory?" Nature Materials, Apr. 2005, pp. 265-266, vol. 4.

Ahn, S. J. et al., "Highly Reliable 5nm Contact Cell Technology for 256Mb PRAM," VLSI Technology, Digest of Technical Papers, Jun. 14-16, 2005, pp. 98-99.

"Optimized Thermal Capacitance in a Phase Change Memory Cell Design," IPCOM000141986D, IP.com Prior Art Database, Oct. 18, 2006, 4pp.

"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.

Atwood, G, et al., "90 nm Phase Change Technology with u Trench and Lance Cell Elements," VLSI Technology, Systems and Applications, Apr. 23-25, 2007, pp. 1-2.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Gleixner, "Phase Change Memory Reliability", 22nd NVSMW, Aug. 26, 2007, 46 pages.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Yamada, Noboru, "Potential of Ge-Sb-Te phase-change optical disks for high-data-rate recording in the near future," (Conference Proceedings Paper), Jul. 30, 1997, vol. 3109, 10 pages.

* cited by examiner

METHOD FOR MAKING A PILLAR-TYPE PHASE CHANGE MEMORY ELEMENT

PARTIES TO A JOINT RESEARCH AGREEMENT

International Business Machines Corporation, a New York corporation; Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates to high density memory devices based on memory materials, in particular phase change based memory materials, including chalcogenide based materials and other materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state; this difference in resistance can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and by reducing the size of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 1, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

Problems have arisen in manufacturing such devices with very small dimensions, and with variations in process that meet tight specifications needed for large-scale memory devices. It is desirable therefore to provide a memory cell structure having small dimensions and low reset currents, and a method for manufacturing such structure.

SUMMARY OF THE INVENTION

A first aspect of the invention is directed to a method for making a pillar-type phase change memory element comprising first and second electrode elements and a phase change element therebetween. A chlorine-sensitive phase change material is selected. A first electrode element is formed. The phase change material is deposited on the first electrode element and a second electrode material is deposited on the phase change material. An etching procedure that does not use a chlorine gas is selected. The second electrode material and the phase change material are etched according to the selected etching procedure to form a second electrode element and a phase change element respectively, thereby creating a pillar-type phase change memory element. The second electrode material depositing step, the phase change material selecting step and the etching procedure selecting step are carried out so that the phase change element is not undercut relative to the second electrode element during the etching step.

In some embodiments the first electrode element forming step may be carried out using at least one of tungsten, polysilicon and titanium nitride for the first electrode element. The second electrode material depositing step may comprise selecting at least one of tungsten and polysilicon. The phase change material selecting step may comprise selecting Ge2Sb2Te5 as the phase change material.

A second aspect of the invention is directed to method for making a pillar-type phase change memory element comprising first and second electrode elements and a phase change element therebetween. First and second electrode materials are selected. A chlorine-sensitive phase change material is selected. A first electrode element, the first electrode element comprising the first electrode material, is formed. The phase change material is deposited on the first electrode element and the second electrode material is deposited on the phase change material. An etching mask is formed over the second electrode material and trimmed. A first etching procedure that does not use a chlorine gas is selected. The second electrode material and the phase change material not masked by the trimmed mask are etched according to the first etching procedure to form a preliminary second electrode element and a preliminary phase change element respectively while redepositing at least one of the first and second electrode materials onto the preliminary phase change element to create a preliminary pillar-type phase change memory element. A second etching procedure that does not use a chlorine gas is selected. The preliminary pillar-type phase change memory element is etched according to the second etching procedure to remove the redeposited etched material thus forming a second electrode element and a phase change element thereby creating a pillar-type phase change memory element. The method is carried out so that the phase change element is not undercut relative to the second electrode element during the preliminary pillar-type phase change memory element etching step.

In some embodiments the first electrode material selecting step comprises selecting at least one of tungsten, polysilicon and titaniun nitride. The second electrode material selecting step may comprise selecting at least one of tungsten and polysilicon. The phase change material selecting step may comprise selecting $Ge_2Sb_2Te_5$ as the phase change material. The second etching procedure selecting step may comprise a plasma etching step.

The method described herein for formation of the phase change gate, for use in a memory cell in a phase change random access memory (PCRAM) device, can be used to make small phase change gates, bridges or similar structures for other devices.

Various features and advantages of the invention will appear from the following description in which the preferred embodiments have been set forth in detail in conjunction with the accompanying drawings.

BRIEF DESCRIPTION OF THE DRAWINGS

FIGS. 1-7 illustrate methods for making pillar-type phase change memory elements;

DETAILED DESCRIPTION

The following description of the invention will typically be with reference to specific structural embodiments and methods. It is to be understood that there is no intention to limit the invention to the specifically disclosed embodiments and methods but that the invention may be practiced using other features, elements, methods and embodiments. Like elements in various embodiments are commonly referred to with like reference numerals.

Figure 1:
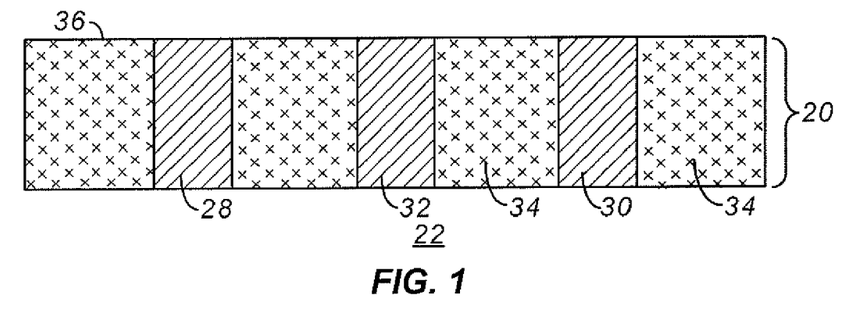
FIG. 1 illustrates the final stages for making a memory cell access layer.

Methods for making pillar-type a phase change memory elements will be described with reference to FIGS. 1-7. Referring now to FIG. 1, a memory cell access layer 20 is shown formed on a substrate 22. Access layer 20 typically comprises access transistors (not shown); other types of access devices may also be used. Access layer 20 comprises first, second and third plugs 28, 30 and 32 all within a dielectric film layer 34. First, second and third plugs 28, 30 and 32, which will act as first electrode elements, are typically made of tungsten, polysilicon or TiN. Memory cell access layer 20 has an upper surface 36.

Figure 2:
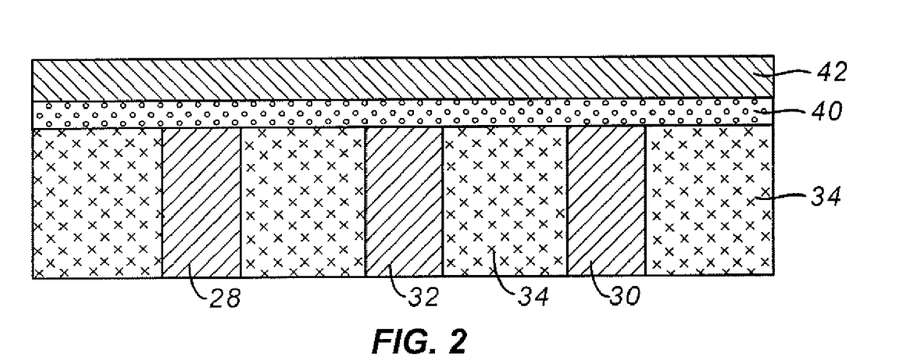
FIG. 2 illustrates the result of depositing a phase change material layer and a second electrode layer onto the structure of FIG. 1.

FIG. 2 illustrates the results of the deposition of a phase change material, such as $Ge_2Sb_2Te_5$ (GST), on upper surface 36 to create a phase change material layer 40. Phase change material layer 40 is preferably about 20 to 120 nm thick, typically about 80 nm thick. A second electrode layer 42 is deposited on layer 40. Second electrode layer 42 is typically tungsten or polysilicon, and is preferably about 40 to 100 nm thick, typically about 80 nm thick. The choice of the phase change material, as well as the materials from which the electrodes are made, is discussed in more detail below.

Figure 3:
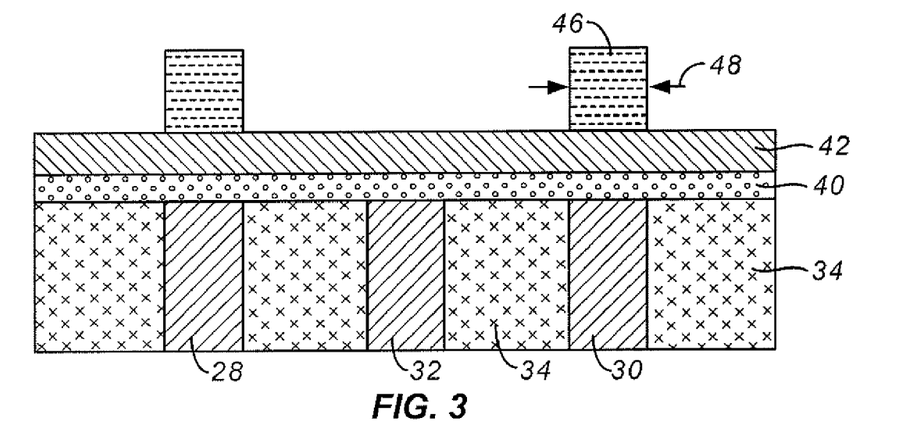
FIG. 3 shows a lithographic mask formed on the structure of FIG. 2.
Figure 4:
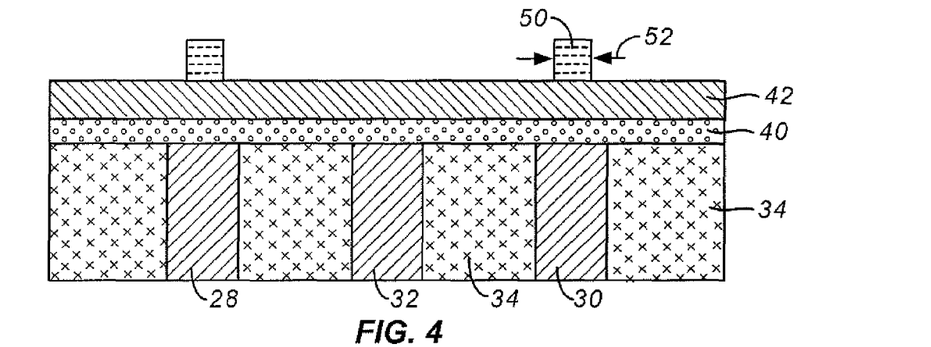
FIG. 4 illustrates the results of trimming the lithographic mask of FIG. 3.

FIG. 3 illustrates the results of the creation of a lithographic mask 46 generally centered over plugs 28, 30 32. Lithographic mask 46 typically has a lateral dimension 48 about equal to the minimum lithographic feature size for the lithographic process used. To reduce the lateral dimension 48 of lithographic mask 46, a mask trimming procedure is undertaken, the results of which creates the trimmed lithographic mask of 50 illustrated in FIG. 4. The lateral dimension 52 of trimmed lithographic mask 50 can therefore be smaller than the minimum lithographic feature size used to create lithographic mask 46. In one example lateral dimension 48 is preferably about 40 to 100 nm, and typically about 60 nm while lateral dimension 52 is preferably about 10 to 80 nm, and typically about 40 nm.

Figure 5:
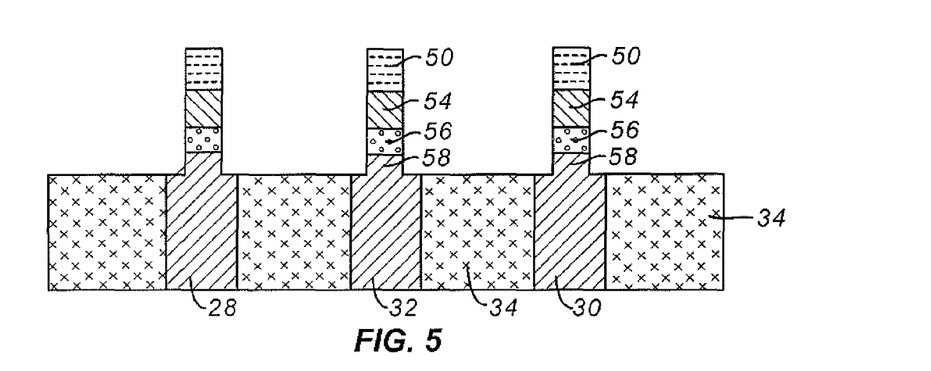
FIG. 5 shows the results of etching the structure of FIG. 6 and the subsequent.
Figure 6:
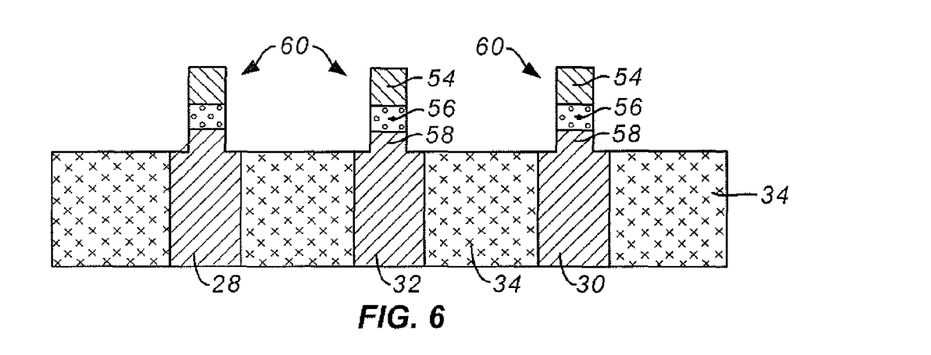
FIG. 6 illustrates the removal of the trimmed lithographic mask from the structure of FIG. 5 creating pillar-type phase change electrode structures.

FIG. 5 illustrates the results of etching second electrode layer 42 and phase change material layer 40 and the partial etching of dielectric film layer 34 and plugs 28, 30 and 32. FIG. 6 illustrates the subsequent removal of trimmed lithographic mask 50 to leave phase change elements 56 captured between first electrode elements 58 and second electrode elements 54. The size of phase change elements 56 is minimized to reduce the reset current required by minimizing the thickness of phase change material layer 40 and by using trimmed lithographic mask 50.

During conventional etching steps, phase change element 56 may be undercut thus weakening the resulting pillar-type phase change element structure 60 shown in FIG. 6. To prevent this, the second electrode material is selected, the phase change material is selected and the etching procedure is selected so that phase change element 56 is not undercut relative to second electrode element 54 during etching. In some embodiments first electrode element 58 and second electrode element 54 are selected to be capable of being etched without the use of chlorine gas. In some embodiments: first electrode element 58 is formed using at least one of tungsten, polysilicon and titanium nitride; second electrode element 54 is formed using at least one of tungsten and polysilicon; phase change element 56 is formed using $Ge_2Sb_2Te_5$ as the phase change material; and etching is carried out without the use of a chlorine gas. One chlorine-free etching recipe comprises $CF_4/CHF_3/Ar/O_2$. Other electrode materials, phase change materials and etching recipes may also be used. While chlorine-free etching is important when phase change element 56 is made of GST, other phase change materials may be used requiring the avoidance of chlorine. In addition to GST, other chlorine-sensitive phase change materials may be use requiring the avoidance of chlorine-free etching recipes to avoid undercutting the phase change element.

Figure 7:
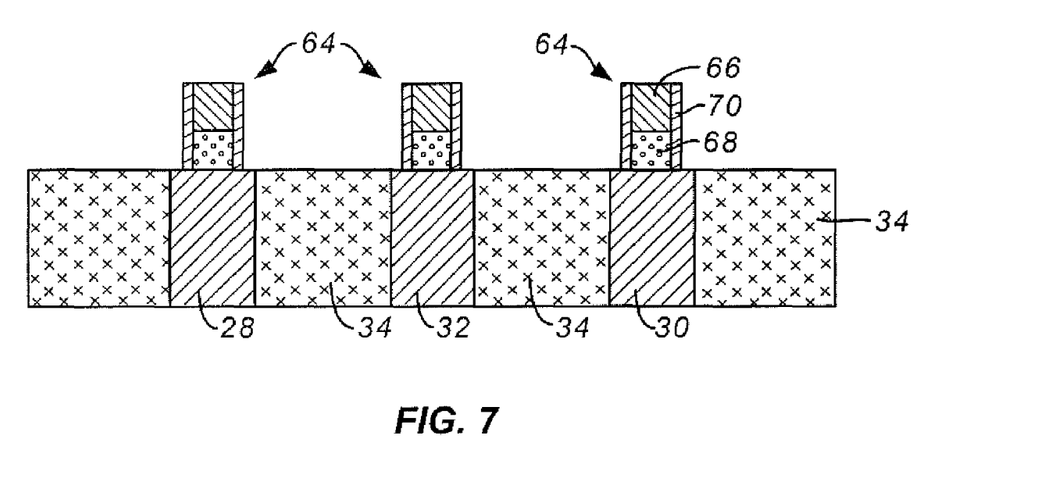
FIG. 7 illustrates an alternative method in which the structure of FIG. 4 is etched in a manner to create a preliminary pillar-type phase change electrode structure having a layer of redeposited electrode material covering the preliminary phase change element, after which a plasma enhanced chemical etch is used to create the structure FIG. 6.

Another embodiment of the invention progresses through FIGS. 1-4 but instead of performing the etching step as discussed with regard to FIG. 5, an etching step is carried out to etch (1) trimmed lithographic mask 52 and (2) second electrode layer 42 and phase change material layer 40 not masked by the mask. Assuming second electrode layer 42 comprises at least one of tungsten and polysilicon and phase change material layer 40 comprises $Ge_2Sb_2Te_5$, a suitable etching recipe is $CF_4/CHF_3/Ar/O_2$. This etching step forms a preliminary pillar-type phase change memory element structure 64 as shown in FIG. 7. Structure 64 includes a preliminary second electrode element 66 and a preliminary phase change element 68 with electrode material 70 redeposit thereon. That is, at least one of the first and second electrode materials from plugs 28, 30, 32 and second electrode layer 42 is redeposited onto preliminary phase change element 68 and typically onto preliminary second electrode element 66. This redeposited electrode material 70 helps to prevent undercutting preliminary phase change element 68. Thereafter, a plasma-enhanced chemical etching step using, for example, $CF_4$ or $CHF_3$, is carried out to over etch structure 64 of FIG. 7 to remove redeposited electrode material 70 while partially etching plugs 28, 30, 32 and dielectric film layer 34 to create the structure of FIG. 6.

Embodiments of memory material elements 16 include phase change based memory materials, including chalcogenide based materials and other materials, for memory material element 16. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IV of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb100_{-(a+b)}$.

One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, columns 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. A material useful for implementation of an RRAM device described herein is $Ge_2Sb_2Te_5$, commonly referred to as GST. Other types of phase change materials can also be used.

The invention has been described with reference to phase change materials. However, other memory materials, also sometimes referred to as programmable materials, can also be used. As used in this application, memory materials are those materials having electrical properties, such as resistance, that can be changed by the application of energy; the change can be a stepwise change or a continuous change or a combination thereof. Other programmable resistive memory materials may be used in other embodiments of the invention, including $N_2$ doped GST, $Ge_xSb_y$, or other material that uses different crystal phase changes to determine resistance; $Pr_xCa_yMnO_3$, PrSrMnO, $ZrO_x$, or other material that uses an electrical pulse to change the resistance state; 7,7,8,8tetracyanoquinodimethane (TCNQ), methanofillerene 6,6-phenyl C61-butyric acid methyl ester (PCBM),TCNQ-PCBM, Cu-TCNQ, Ag-TCNQ, $C_{60}$-TCNQ, TCNQ doped with other metal, or any other polymer material that has bistable or multi-stable resistance state controlled by an electrical pulse. Further examples of programmable resistive memory materials include GeSbTe, GeSb, NiO, Nb—$SrTiO_3$, Ag—GeTe, PrCaMnO, ZnO, $Nb_2O_5$, Cr—$SrTiO_3$.

The following is a short summary describing a type of a resistive memory material.

Challecogenide Material x:y:z=2:2:5

Or other compositions with x: 0~5; y: 0~5; z: 0~10

GeSbTe with doping, such as N—, Si—, Ti—, or other element doping may also be used.

Formation method: By PVD sputtering or magnetron-sputtering method with reactive gases of Ar, $N_2$, and/or He, etc @ the pressure of 1 mtorr~100 mtorr. The deposition is usually done at room temperature. The collimator with aspect ratio of 1~5 can be used to improve the fill-in performance. To improve the fill-in performance, the DC bias of several ten to several hundred volts is also used. On the other hand, the combination of DC bias and the collimator can be used simultaneously.

The post deposition annealing treatment with vacuum or N2 ambient is sometimes needed to improve the crystallize state of chalcogenide material. The annealing temperature typically ranges 100 C to 400 C with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states.

For additional information on the manufacture, component materials, use and operation of phase change random access memory devices, see U.S. patent application Ser. No. 11/155,067, filed 17 Jun. 2005, entitled Thin Film Fuse Phase Change Ram And Manufacturing Method.

The above descriptions may have used terms such as above, below, top, bottom, over, under, et cetera. These terms are used to aid understanding of the invention are not used in a limiting sense.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

Any and all patents, patent applications and printed publications referred to above are hereby incorporated by reference.

What is claimed is:

1. A method for making a pillar-type phase change memory element comprising first and second electrode elements and a phase change element therebetween, comprising:
    selecting a chlorine-sensitive phase change material;
    forming a first electrode element;
    depositing the phase change material on the first electrode element;
    depositing a second electrode material on the phase change material;
    selecting an etching procedure that does not use a chlorine gas;
    etching the second electrode material and the phase change material according to the selected etching procedure to form a second electrode element and a phase change element respectively, thereby creating a pillar-type phase change memory element; and
    carrying out the second electrode material depositing step, the phase change material selecting step and the etching procedure selecting step so that the phase change element is not undercut relative to the second electrode element during the etching step.

2. The method according to claim 1 wherein the first electrode element forming step is carried out using at least one of tungsten, polysilicon and titanium nitride for the first electrode element.

3. The method according to claim 1 wherein the second electrode material depositing step comprises selecting at least one of tungsten and polysilicon as the second electrode material.

4. The method according to claim 1 wherein the phase change material selecting step comprises selecting Ge2Sb2Te5 as the phase change material.

5. The method according to claim 1 further comprising the step of selecting a first electrode material for the first electrode element, and wherein the first and second electrode materials are selected to be capable of being etched without the use of a chlorine gas.

6. A method for making a pillar-type phase change memory element comprising first and second electrode elements and a phase change element therebetween, comprising:
    selecting a first electrode material;
    selecting a second electrode material;
    selecting a chlorine-sensitive phase change material;
    forming a first electrode element, the first electrode element comprising the first electrode material;
    depositing the phase change material on the first electrode element;
    depositing the second electrode material on the phase change material;
    forming an etching mask over the second electrode material;
    trimming the etching mask to create a trimmed etching mask;
    selecting a first etching procedure that does not use a chlorine gas;
    etching the second electrode material and the phase change material not masked by the trimmed etching mask, according to the first etching procedure to form a preliminary second electrode element and a preliminary phase change element respectively while redepositing at least one of the first and second electrode materials onto the preliminary phase change element to create a preliminary pillar-type phase change memory element;
    selecting a second etching procedure that does not use a chlorine gas;
    etching the preliminary pillar-type phase change memory element according to the second etching procedure to completely remove the redeposited material thus forming a second electrode element and a phase change element thereby creating a pillar-type phase change memory element; and
    the method being carried out so that the phase change element is not undercut relative to the second electrode element during the preliminary pillar-type phase change memory element etching step.

7. The method according to claim 6 wherein the first electrode material selecting step comprises selecting at least one of tungsten, polysilicon and titanium nitride.

8. The method according to claim 6 wherein the second electrode material selecting step comprises selecting at least one of tungsten and polysilicon.

9. The method according to claim 6 wherein the phase change material selecting step comprises selecting Ge2Sb2Te5 as the phase change material.

10. The method according to claim 6 wherein the second etching procedure selecting step comprises a plasma etching step.

* * * * *